(12) United States Patent
Fujimoto

(10) Patent No.: US 11,251,271 B2
(45) Date of Patent: Feb. 15, 2022

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Takumi Fujimoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/039,525

(22) Filed: Sep. 30, 2020

(65) Prior Publication Data

US 2021/0167173 A1    Jun. 3, 2021

(30) Foreign Application Priority Data

Nov. 29, 2019   (JP) .............................. JP2019-217349

(51) Int. Cl.
| | |
|---|---|
| *H01L 29/16* | (2006.01) |
| *H01L 29/45* | (2006.01) |
| *H01L 21/203* | (2006.01) |
| *H01L 29/423* | (2006.01) |
| *H01L 21/02* | (2006.01) |
| *H01L 21/04* | (2006.01) |

(52) U.S. Cl.
CPC .... *H01L 29/1608* (2013.01); *H01L 21/02293* (2013.01); *H01L 21/046* (2013.01); *H01L 21/2033* (2013.01); *H01L 29/4236* (2013.01); *H01L 29/456* (2013.01)

(58) Field of Classification Search
None
See application file for complete search history.

(56) References Cited

U.S. PATENT DOCUMENTS

| | | | |
|---|---|---|---|
| 11,004,839 B1* | 5/2021 | Deng | .................. H01L 27/0255 |
| 2016/0086799 A1* | 3/2016 | Hiyoshi | .............. H01L 29/1608 |
| | | | 257/77 |
| 2016/0218176 A1 | 7/2016 | Hiyoshi et al. | |

(Continued)

FOREIGN PATENT DOCUMENTS

| | | |
|---|---|---|
| JP | 6183080 B2 | 8/2017 |
| JP | 2019080035 A | 5/2019 |

*Primary Examiner* — Alexander G Ghyka
(74) *Attorney, Agent, or Firm* — Rabin & Berdo, P.C.

(57) ABSTRACT

A semiconductor device having a semiconductor substrate that includes first to third epitaxial layers provided sequentially on a starting substrate, the third epitaxial layer forming a pn junction with the second epitaxial layer, and including a plurality of first semiconductor regions formed on a second semiconductor region. The semiconductor device further includes a plurality of trenches penetrating the first and second semiconductor regions to reach the second epitaxial layer, a plurality of gate electrodes provided in the trenches respectively via a gate insulating film, a metal film in ohmic contact with the first semiconductor regions, a first electrode electrically connected to the first semiconductor regions via the metal film, and a second electrode provided at a back surface of the starting substrate. Each of the starting substrate and the first to third epitaxial layers contains silicon carbide. The silicon carbide semiconductor device has a vacancy trap in an entire area of the semiconductor substrate.

8 Claims, 11 Drawing Sheets

(56) References Cited

U.S. PATENT DOCUMENTS

| | | | | |
|---|---|---|---|---|
| 2017/0271442 A1* | 9/2017 | Uehara | ............... | H01L 29/7802 |
| 2018/0301536 A1* | 10/2018 | Utsumi | ................... | H01L 29/51 |
| 2019/0296156 A1* | 9/2019 | Shimizu | ............. | H01L 21/0485 |
| 2020/0091334 A1* | 3/2020 | Mizukami | ............ | H01L 29/0623 |
| 2020/0144371 A1* | 5/2020 | Tawara | ................. | H01L 21/046 |
| 2021/0167167 A1* | 6/2021 | Kawada | ............ | H01L 29/66068 |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2019-217349, filed on Nov. 29, 2019, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, it is known that in a vertical metal oxide semiconductor field effect transistor (MOSFET) using silicon carbide (SiC) as a semiconductor material and including an insulated gate having a three-layered structure including a metal, an oxide film, and a semiconductor, when forward current flows in a parasitic diode (body diode) formed by a pn junction between a p-type base region and an n$^-$-type drift region, basal plane dislocations (BPDs) of an n$^+$-type starting substrate (bulk crystal substrate) expand in an n$^-$-type epitaxial layer that forms the n$^-$-type drift region on the n$^+$-type starting substrate and stacking faults are generated.

Thus, a device has been proposed in which a MOSFET and a Schottky barrier diode (SBD) connected in antiparallel to the MOSFET are implemented on a single semiconductor substrate (semiconductor chip) and when the parasitic diode is forward biased, forward current flows through the SBD and the forward current does not flow through the parasitic diode. Further, as a recombination enhancing layer having a short minority carrier (hole (vacancy)) lifetime, an n-type epitaxial layer (n-type buffer region) is disposed between the n$^+$-type starting substrate that forms an n$^+$-type drain region and the n$^-$-type epitaxial layer that forms the n$^-$-type drift region, whereby hole density of the parasitic diode is reduced, enabling suppression of stacking fault growth from the n$^+$-type starting substrate.

A structure of a conventional silicon carbide semiconductor device will be described. FIG. 8 is a cross-sectional view of the structure of the conventional silicon carbide semiconductor device. FIG. 8 depicts a structure of unit cells (functional units of an element) disposed in an active region 141 depicted in FIG. 9. FIG. 9 is a plan view of a state when the conventional silicon carbide semiconductor device is viewed from a front side of the semiconductor substrate. In FIG. 9, a photo luminescence (PL) image of a stacking fault 132 measured by passing forward current through a parasitic diode 130 of a conventional silicon carbide semiconductor device 110 is depicted schematically. FIGS. 10A, 10B, and 10C are characteristics diagrams of net doping concentration distribution and carrier (hole and electron) density distribution along cutting line AA-AA' in FIG. 8.

The conventional silicon carbide semiconductor device 110 depicted in FIGS. 8 and 9 is a vertical MOSFET having a trench gate structure at a front side of a semiconductor substrate (semiconductor chip) 120 containing silicon carbide as a semiconductor material. The semiconductor substrate 120 is an epitaxial substrate in which epitaxial layers 122, 123, 124 forming an n-type buffer region 102, an n$^-$-type drift region 103, and a p-type base region 104 are sequentially stacked on a front surface of an n$^+$-type starting substrate 121 (an n$^+$-type drain region 101). In the p-type epitaxial layer 124, n$^+$-type source regions 105 and p$^+$-type contact regions 106 are each selectively provided in surface regions of the semiconductor substrate 120 at a front surface (surface of the p-type epitaxial layer 124) that is a main surface of the semiconductor substrate 120.

For the conventional silicon carbide semiconductor device 110, net doping concentration distribution, hole density distribution of hole current flowing in a forward direction through the parasitic diode 130, and electron density distribution of electron current flowing through the parasitic diode 130, in the semiconductor substrate 120 are indicated along horizontal axes in FIGS. 10A to 10C. Reference characters d101, d102, d103, d104 along vertical axes in FIGS. 10A to 10C are respectively depths from the front surface (depth d100) of the semiconductor substrate 120, including a depth to an interface between the n$^+$-type source regions 105 and the p-type base region 104, a depth to a pn junction interface 126 between the p-type base region 104 and the n$^-$-type drift region 103, a depth to an interface between the n$^-$-type drift region 103 and the n-type buffer region 102, and a depth to an Epi/Sub interface 125 described hereinafter.

It was confirmed that when forward current passes through the parasitic diode 130 formed by the pn junction (the pn junction interface 126) between the p-type base region 104 and the n$^-$-type drift region 103, a BPD 131 of an interface (hereinafter, Epi/Sub interface) 125 between the n$^+$-type starting substrate 121 and the epitaxial layers 122 to 124 or a BPD 131 in the n$^+$-type starting substrate 121 expands in the epitaxial layers 122 to 124, generating the stacking faults 132 (triangular stacking fault 132a, bar-shaped stacking fault 132b) (FIGS. 8, 9). The hole density of the hole current and the electron density of the electron current of the parasitic diode 130 are both uniform from the n$^-$-type drift region 103 across the n-type buffer region 102 (FIGS. 10B, 10C).

The net doping concentration of the n$^-$-type drift region 103 is uniform from the pn junction interface 126 (depth d102) between the p-type base region 104 and the n$^-$-type drift region 103, to the interface (depth d103) between the n$^-$-type drift region 103 and the n-type buffer region 102 (FIG. 10A). The net doping concentration being uniform means a same net doping concentration within a range (for example, at most ±5%) that includes an allowable error due to process variation. Reference numerals 107, 108, 109, 111, 113, 114, 115, and 142 are gate trenches, a gate insulating film, gate electrodes, an interlayer insulating film, a source electrode, a drain electrode, a gate pad, and an edge termination region, respectively. Reference numeral 112 is a metal silicide film (hereinafter, ohmic electrode) in ohmic contact with the semiconductor substrate 120.

As a conventional silicon carbide semiconductor device, a device has been proposed in which a $Z_{1/2}$ center is introduced at a concentration in a range from $1\times10^{13}/cm^3$ to $1\times10^{15}/cm^3$ in a drift region by electron beam irradiation, and a minority carrier lifetime of the drift region is set to 0.1 µs (for example, refer to Japanese Patent No. 6183080). In Japanese Patent No. 6183080, holes injected into the drift region from a base region are caused to recombine with electrons present in the drift region at the $Z_{1/2}$ center, whereby recombination of the holes injected into the drift region from the base region and electrons injected into the drift region from the drain electrode is suppressed, thereby suppressing the occurrence of stacking faults caused by the recombination of the electrons and the holes in the drift region.

SUMMARY OF THE INVENTION

According to an embodiment of the invention, a silicon carbide semiconductor device has a pn junction through which a current flows in a forward direction. The silicon carbide semiconductor device includes a semiconductor substrate, including a starting substrate of a first conductivity type, having a first main surface and a second main surface opposite to each other, and a first epitaxial layer of the first conductivity type, a second epitaxial layer of the first conductivity type, and a third epitaxial layer, provided sequentially on the first main surface of the starting substrate, the first epitaxial layer having an impurity concentration lower than an impurity concentration of the starting substrate, the second epitaxial layer having an impurity concentration lower than the impurity concentration of the first epitaxial layer, the third epitaxial layer forming the pn junction with the second epitaxial layer, and including a plurality of first semiconductor regions of the first conductivity type formed on a second semiconductor region of a second conductivity type; the silicon carbide semiconductor device including a plurality of trenches penetrating the plurality of first semiconductor regions respectively and the second semiconductor region, and reaching the second epitaxial layer; a plurality of gate electrodes provided in the plurality of trenches respectively via a gate insulating film; a metal film in ohmic contact with the plurality of first semiconductor regions; a first electrode electrically connected to the first semiconductor regions via the metal film; and a second electrode provided at the second main surface of the starting substrate. Each of the starting substrate and the first, second and third epitaxial layers contains silicon carbide. The silicon carbide semiconductor device has a vacancy trap in an entire area of the semiconductor substrate, and the second epitaxial layer has a minority carrier lifetime that is at most 70 ns.

In the embodiment, the pn junction forms a parasitic diode. A hole density of a hole current flowing in the forward direction through the parasitic diode decreases in the second epitaxial layer with increasing proximity to an interface between the first epitaxial layer and the starting substrate, from the pn junction.

In the embodiment, a hole density at the interface between the first epitaxial layer and the starting substrate is at most $1 \times 10^{15}/cm^3$.

In the embodiment, the metal film is further in ohmic contact with the second semiconductor region, and the first electrode is further electrically connected to the second semiconductor region via the metal film.

According to another embodiment of the invention, a method of manufacturing a silicon carbide semiconductor device having a pn junction through which a current flows in a forward direction, includes: preparing a semiconductor substrate, including preparing a starting substrate of a first conductivity type having a first main surface and a second main surface opposite to each other; forming a first epitaxial layer of the first conductivity type at the first main surface of the starting substrate, the first epitaxial layer having an impurity concentration lower than an impurity concentration of the starting substrate; forming a second epitaxial layer of the first conductivity type on the first epitaxial layer, the second epitaxial layer having an impurity concentration lower than the impurity concentration of the first epitaxial layer; forming a third epitaxial layer of a second conductivity type on the second epitaxial layer, the third epitaxial layer forming the pn junction with the second epitaxial layer, where each of the starting substrate and the first, second and third epitaxial layers contains silicon carbide; forming a metal film in ohmic contact with the third epitaxial layer; irradiating an entire area of the semiconductor substrate with an electron beam at an irradiation dose in a range from 200 kGy to 800 kGy; forming a first electrode electrically connected to the third epitaxial layer via the metal film, after irradiating the entire area of the semiconductor substrate with the electron beam; sintering the first electrode through a heat treatment at a temperature of at most 460 degrees C.; and forming a second electrode on the second main surface of the starting substrate.

In the embodiment, the irradiation dose of the electron beam is at most 500 kGy.

In the embodiment, the method further including: after forming the third epitaxial layer but before forming the metal film, selectively forming a plurality of first semiconductor regions of the first conductivity type, at surface regions of the third epitaxial layer, a part of the third epitaxial layer excluding the plurality of first semiconductor regions being a second semiconductor region of the second conductivity type; forming a plurality of trenches penetrating the plurality of first semiconductor regions respectively and second semiconductor region, and reaching the second epitaxial layer; and forming a plurality of gate electrodes in the plurality of trenches respectively via a gate insulating film. The metal film is formed in ohmic contact with the plurality of first semiconductor regions. The first electrode is formed electrically connected to the plurality of first semiconductor regions via the metal film. After irradiating the entire area of the semiconductor substrate with the electron beam but before forming the first electrode, the gate insulating film is irradiated at sidewalls of the plurality of trenches with an ultraviolet ray from a surface of the third epitaxial layer, under a temperature environment of at most 460 degrees C., the ultraviolet ray having a wavelength that is at most 390 nm.

In the embodiment, the metal film is formed further in ohmic contact with the second semiconductor region, and the first electrode is formed further electrically connected to the second semiconductor region via the metal film.

Objects, features, and advantages of the present invention are specifically set forth in or will become apparent from the following detailed description of the invention when read in conjunction with the accompanying drawings.

DETAILED DESCRIPTION OF THE INVENTION

Figure 8:
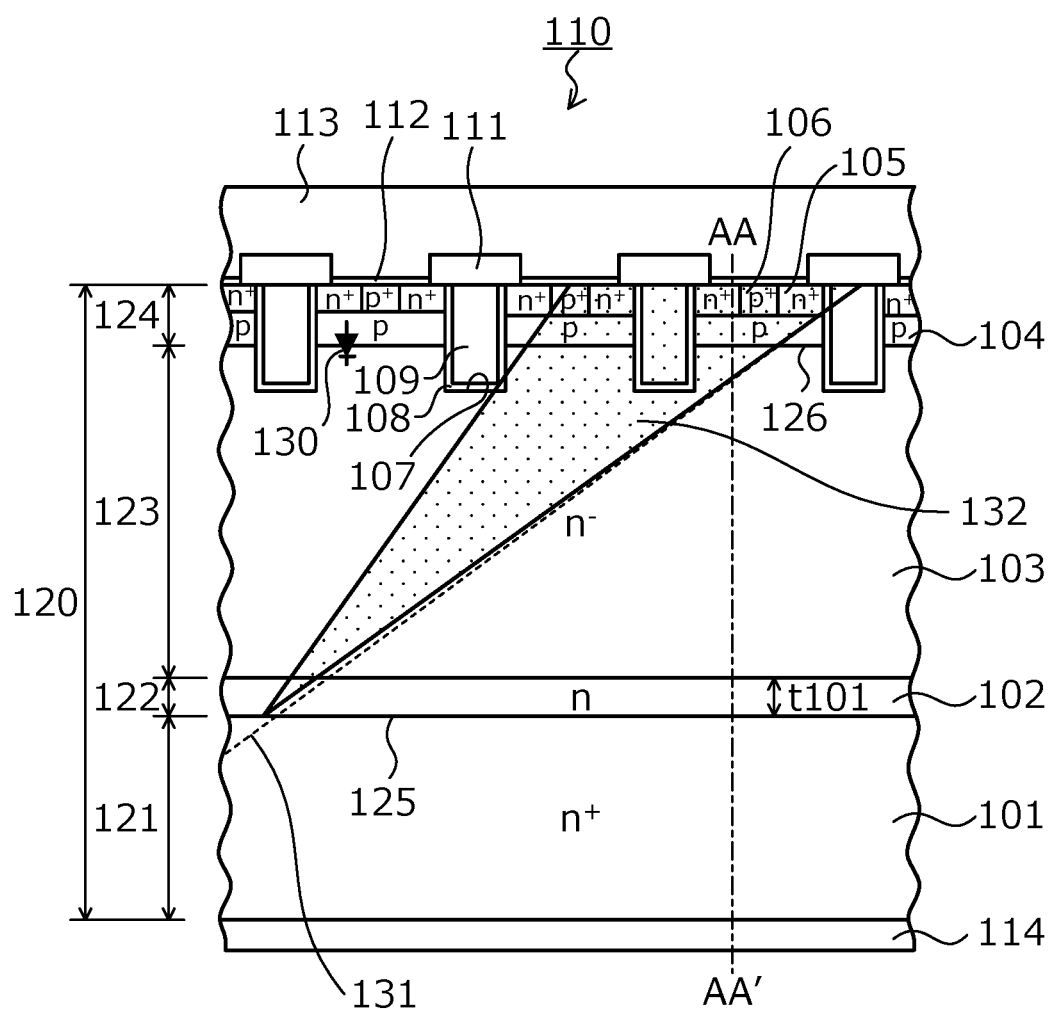
FIG. 8 is a cross-sectional view of a structure of a conventional silicon carbide semiconductor device.
Figure 9:
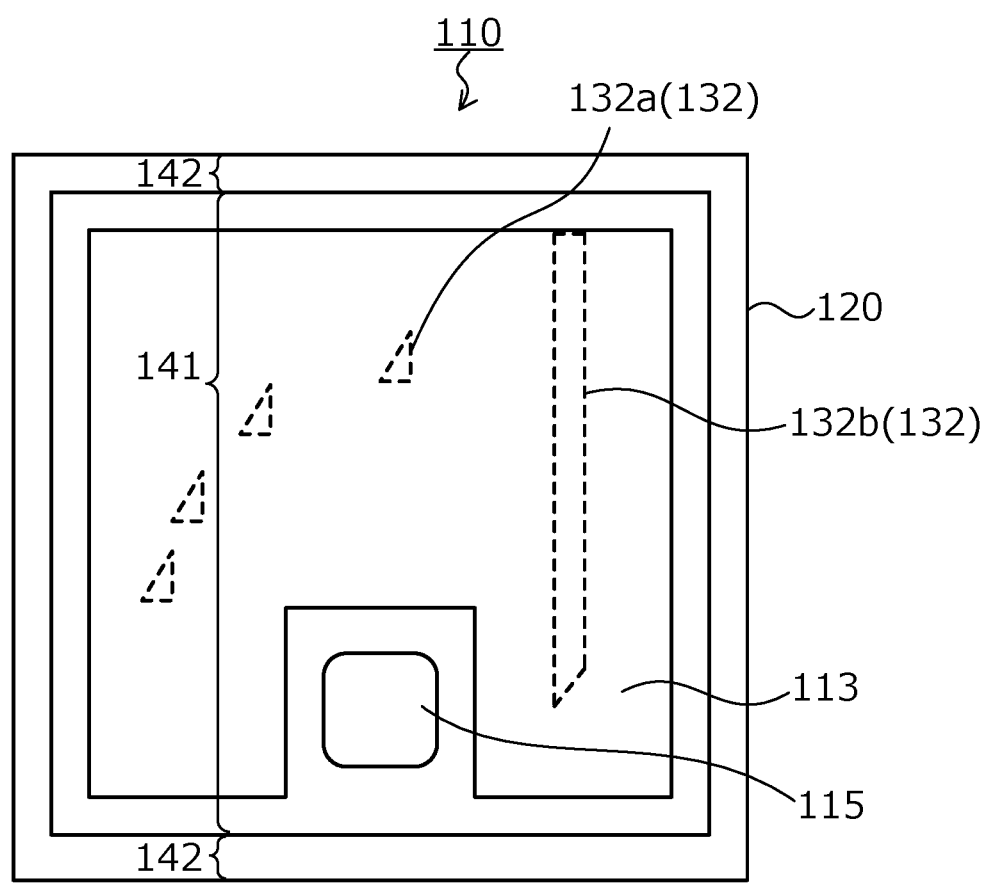
FIG. 9 is a plan view of a state when the conventional silicon carbide semiconductor device is viewed from a front side of a semiconductor substrate.
Figure 10A:
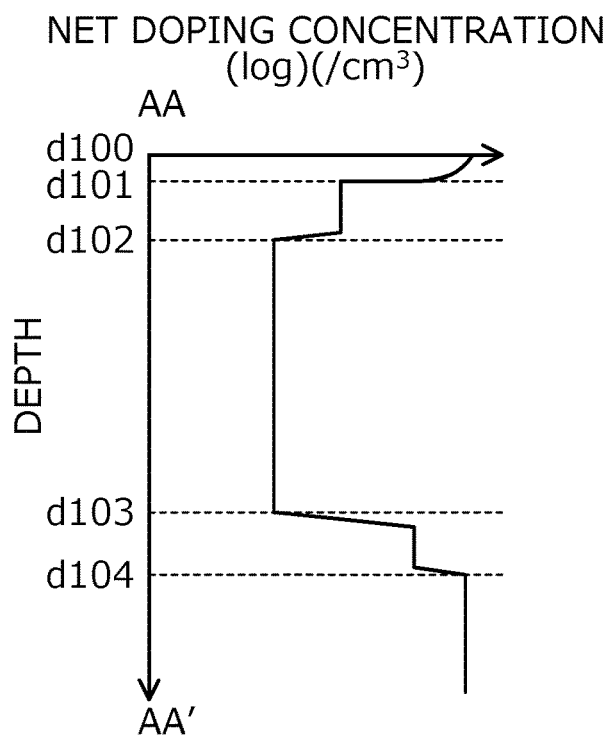
FIG. 10A is a characteristics diagram of net doping concentration distribution along cutting line AA-AA' in FIG. 8.

First, problems associated with the conventional techniques will be discussed. In the conventional silicon carbide semiconductor device 110 (refer to FIGS. 8 to 10), to have an n-type epitaxial layer 122 that forms the n-type buffer region 102 function as a recombination enhancing layer having a short lifetime for the holes (minority carriers) injected from the p-type base region 104, a thickness of the n-type epitaxial layer 122 has to be in a range from about 5 µm to 10 µm, and an impurity concentration thereof has to be at least $2\times10^{18}$ atoms/cm$^3$. Nonetheless, accurately controlling the thickness and the impurity concentration in order to grow the n-type epitaxial layer 122 to have favorable film quality is difficult. Further, epitaxial layers are expensive and therefore, the unit cost of the semiconductor substrate 120 increases.

Further, in a method recited in Japanese Patent No. 6183080, while an irradiation dose of the electron beam irradiation for introducing the $Z_{1/2}$ center into the drift region is high, after this electron beam irradiation, there is a high-temperature heat treatment (for example, about 950 degrees C.) for forming the ohmic electrodes. A part of the $Z_{1/2}$ center that is minority carrier lifetime killer disappears in the drift region due to this high-temperature heat treatment, whereby the minority carrier lifetime recovers and becomes longer. In the method recited in Japanese Patent No. 6183080, the minority carrier lifetime of the drift region is long at 0.1 µs and does not reduce the hole density of the parasitic diode and therefore, has a small effect of suppressing the occurrence of stacking faults.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
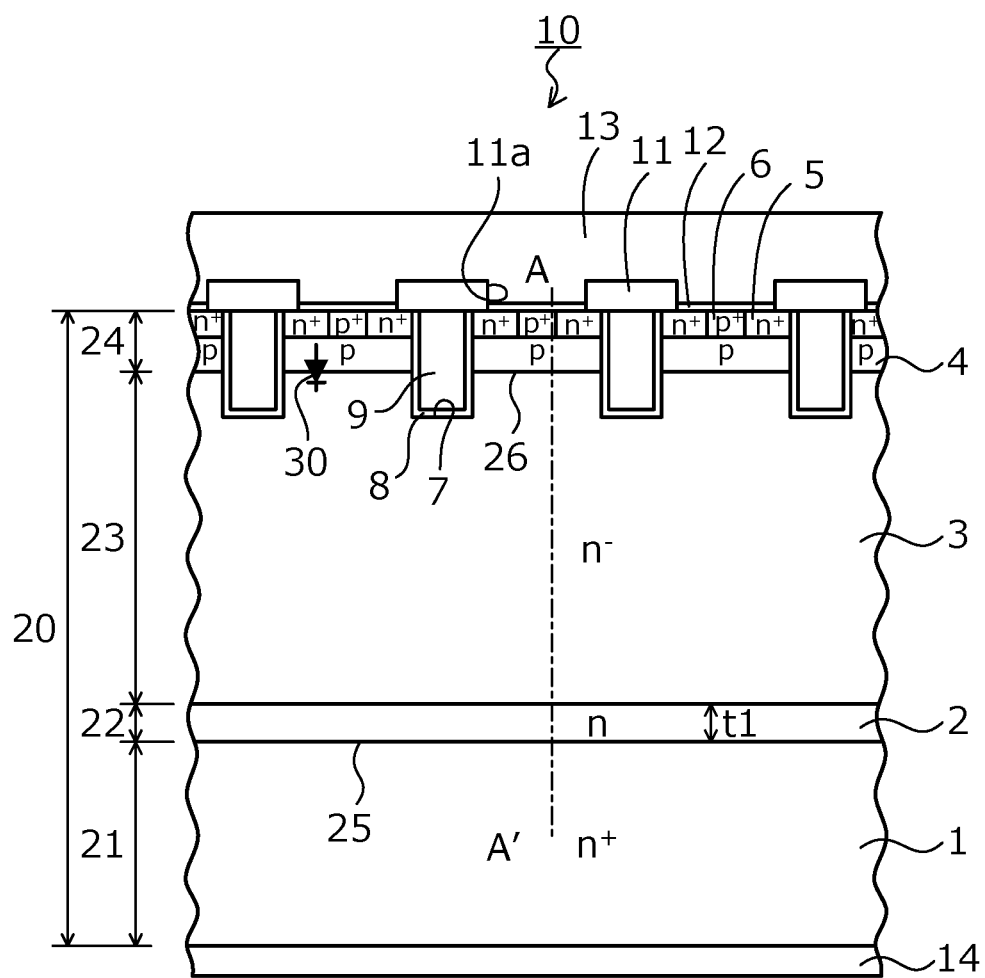
FIG. 1 is a cross-sectional view of a structure of a silicon carbide semiconductor device according to a first embodiment.
Figure 2A:
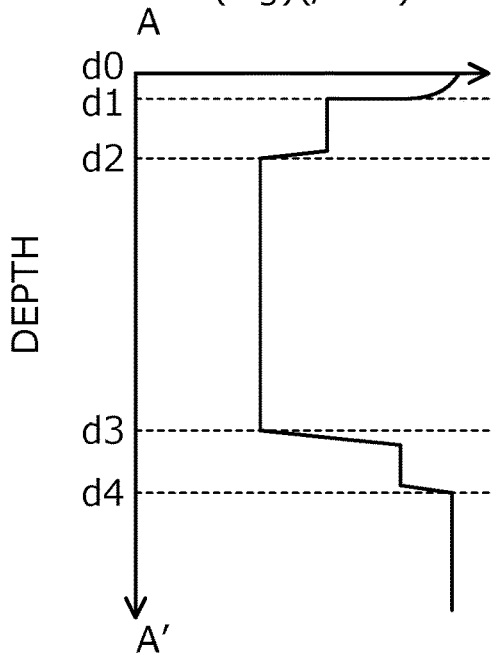
FIG. 2A is a characteristics diagram depicting net doping concentration distribution along cutting line A-A' in FIG. 1.
Figure 2B:
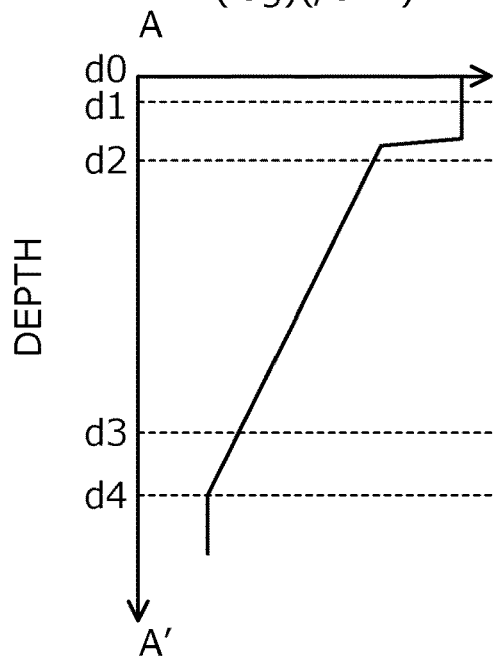
FIG. 2B is a characteristics diagram depicting hole density distribution along cutting line A-A' in FIG. 1.

A structure of a silicon carbide semiconductor device according to a first embodiment will be described. FIG. 1 is a cross-sectional view of the structure of the silicon carbide semiconductor device according to the first embodiment. FIGS. 2A and 2B are characteristics diagrams depicting net doping concentration distribution and hole density distribution along cutting line A-A' in FIG. 1. A silicon carbide semiconductor device 10 according to the first embodiment depicted in FIG. 1 is a vertical MOSFET having a general trench gate structure at a front side of a semiconductor substrate (semiconductor chip) 20 containing silicon carbide (SiC) as a semiconductor material.

The semiconductor substrate 20 is an epitaxial substrate in which epitaxial layers (first, second, third epitaxial layers) 22, 23, 24 respectively forming an n-type buffer region 2, an n$^-$-type drift region 3, and a p-type base region (second semiconductor region) 4 are sequentially stacked on a front surface of an n$^+$-type starting substrate 21 that contains silicon carbide as a semiconductor material. The semiconductor substrate 20 has a main surface that is a surface of the p-type epitaxial layer 24 and is regarded as a front surface, the semiconductor substrate 20 has another main surface that is a surface (back surface of the n$^+$-type starting substrate 21) of the n$^+$-type starting substrate 21 and regarded as a back surface. In an entire area of the semiconductor substrate 20, a $Z_{1/2}$ center (vacancy trap) is introduced at a defect concentration in a range, for example, from about $5\times10^{11}$/cm$^3$ to $2\times10^{13}$/cm$^3$.

The n$^+$-type starting substrate 21 is an n$^+$-type drain region 1. The n-type epitaxial layer 22 is the n-type buffer region 2. The n-type buffer region 2 functions as a recombination enhancing layer having short lifetime for minority carriers (holes (vacancies)). The n-type buffer region 2 has a thickness that is in a range, for example, from about 0.1 µm to 1.0 µm. The n-type buffer region 2 has an impurity concentration that is in a range, for example, from about $1\times10^{17}$ atoms/cm$^3$ to $1\times10^{18}$ atoms/cm$^3$. The n-type buffer region 2 has a minority carrier lifetime that is shorter than a minority carrier lifetime of the n$^-$-type drift region 3 and, for example, at most 100 ns.

The n$^-$-type epitaxial layer 23 is the n$^-$-type drift region 3 and is in contact with the n-type buffer region 2 in a depth direction. The n$^-$-type drift region 3 has an impurity concentration that is in a range, for example, from about $1\times10^{15}$ atoms/cm$^3$ to $1\times10^{17}$ atoms/cm$^3$. The minority carrier lifetime of the n$^-$-type drift region 3 is, for example, at most 70 ns. In the n-type buffer region 2 and in the n$^-$-type drift region 3, the $Z_{1/2}$ center is a minority carrier (hole (vacancy)) lifetime killer. A part of the p-type epitaxial layer 24 excluding n$^+$-type source regions (first semiconductor regions) 5 and p$^+$-type contact regions 6 described hereinafter is the p-type base region 4.

The p-type base region 4 is provided between the front surface of the semiconductor substrate 20 and the n$^-$-type drift region 3, in contact with the n$^-$-type drift region 3. When a parasitic diode 30 formed by a pn junction (pn junction interface 26) between the p-type base region 4 and the n$^-$-type drift region 3 is forward biased, holes injected into the n$^-$-type drift region 3 and the n-type buffer region 2 from the p-type base region 4 recombine with electrons present in the $Z_{1/2}$ center in the n-type buffer region 2 and in the n$^-$-type drift region 3. Therefore, the minority carrier lifetimes of the n$^-$-type drift region 3 and the n-type buffer region 2 are shortened to within the ranges described above.

Logarithms (logs) of a net doping concentration in the semiconductor substrate 20 and a hole density of hole current (forward current) flowing in the forward direction through the parasitic diode 30 are shown along horizontal axes in FIGS. 2A and 2B, respectively. Reference characters d1, d2, d3, and d4 along vertical axes in FIGS. 2A and 2B are respectively depths from the front surface of the semiconductor substrate 20 (d0=0 μm), including a depth to an interface between the n$^+$-type source regions 5 and the p-type base region 4, a depth to the pn junction interface 26 between the p-type base region 4 and the n$^-$-type drift region 3, a depth to an interface between the n$^-$-type drift region 3 and the n-type buffer region 2, and a depth to an Epi/Sub interface 25 described hereinafter.

The hole density of the hole current of the parasitic diode 30 is constant from the front surface of the semiconductor substrate 20 (depth d0), to the pn junction interface 26 (depth d2) between the p-type base region 4 and the n$^-$-type drift region 3 and a maximum value is shown. Further, the minority carrier lifetime of the n$^-$-type drift region 3 is shortened, whereby the hole density of the hole current of the parasitic diode 30 decreases linearly at a predetermined rate of decrease, from the pn junction interface 26 between the p-type base region 4 and the n$^-$-type drift region 3 to the interface (Epi/Sub interface) 25 (depth d4) between the n$^+$-type starting substrate 21 and the epitaxial layers 22 to 24.

Figure 10B:
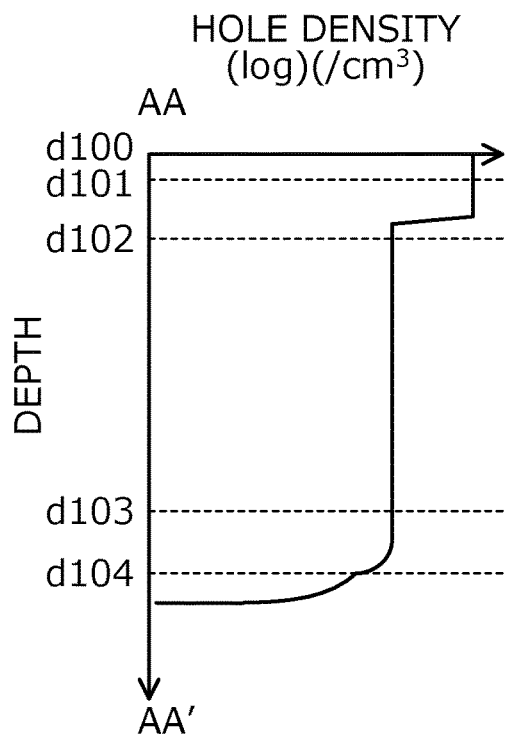
FIG. 10B is a characteristics diagram of carrier (hole) density distribution along cutting line AA-AA' in FIG. 8.
Figure 10C:
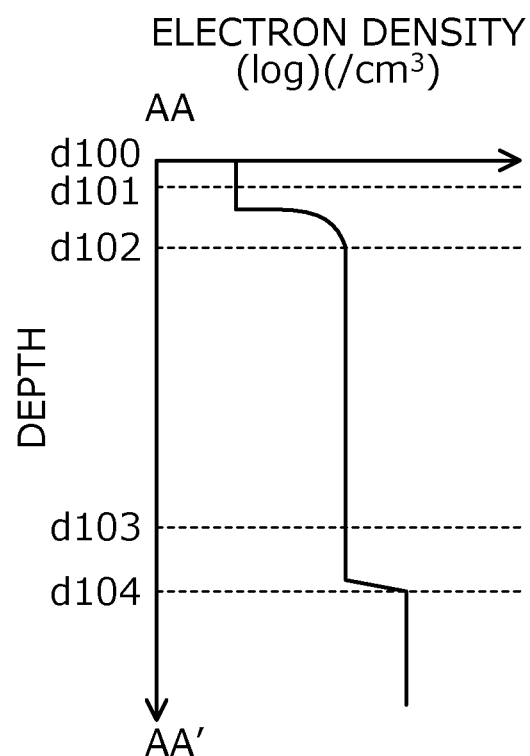
FIG. 10C is a characteristics diagram of carrier (electron) density distribution along cutting line AA-AA' in FIG. 8.

With the hole density distribution of the hole current of the parasitic diode 30 described above, the hole density at the Epi/Sub interface 25 is reduced at least 100 times as compared to the hole density at the Epi/Sub interface 125 (depth d104) of the conventional structure (refer to FIG. 10B). Therefore, the hole density at the Epi/Sub interface 25 may be set to a hole density at which stacking faults do not occur. For example, when an irradiation dose of an electron beam irradiation 41 (refer to FIG. 4) for the semiconductor substrate 20 is 300 kGy, the hole current density flowing in the forward direction through the parasitic diode 30 is 1500 A/cm$^2$ while the hole density from the Epi/Sub interface 25 to a drain side is at most about 1×1015/cm$^3$.

Between the front surface of the semiconductor substrate 20 and the p-type base region 4, the n$^+$-type source regions 5 and the p$^+$-type contact regions 6 are selectively provided so as to be exposed at the front surface of the semiconductor substrate 20 and in contact with the p-type base region 4. The p-type base region 4 may be exposed at the front surface of the semiconductor substrate 20 without providing the p$^+$-type contact regions 6. Trenches 7 penetrate the n$^+$-type source regions 5 and the p-type base region 4 in the depth direction from the front surface of the semiconductor substrate 20 and reach the n$^-$-type drift region 3. In the trenches 7, gate electrodes 9 are provided on a gate insulating film 8.

Trench gate structures are configured by the p-type base region 4, the n$^+$-type source regions 5, the p$^+$-type contact regions 6, the trenches 7, the gate insulating film 8, and the gate electrodes 9, as front surface element structures of the front side of the semiconductor substrate 20. An interlayer insulating film 11 is provided at an entire area of the front surface of the semiconductor substrate 20 and covers the gate electrodes 9. Contact holes 11a that penetrate the interlayer insulating film 11 in the depth direction and reach the semiconductor substrate 20 are provided. In the contact holes 11a, a metal silicide film (ohmic electrode) 12 that is in ohmic contact with the front surface of the semiconductor substrate 20 (the n$^+$-type source regions 5 and the p$^+$-type contact regions 6) is provided.

The ohmic electrodes 12 are in ohmic contact with the n$^+$-type source regions 5 and the p$^+$-type contact regions 6, and are electrically connected to the p-type base region 4, the n$^+$-type source regions 5, and the p$^+$-type contact regions 6. In an instance where the p$^+$-type contact regions 6 are not provided, the ohmic electrodes 12 are in ohmic contact with the p-type base region 4 instead of the p$^+$-type contact regions 6. A source electrode 13 is in contact with the ohmic electrodes 12 and electrically connected to the ohmic electrodes 12. A drain electrode 14 is provided at an entire area of the back surface (back surface of the n$^+$-type starting substrate 21) of the semiconductor substrate 20 and is electrically connected to the n$^+$-type drain region 1.

Figure 3:
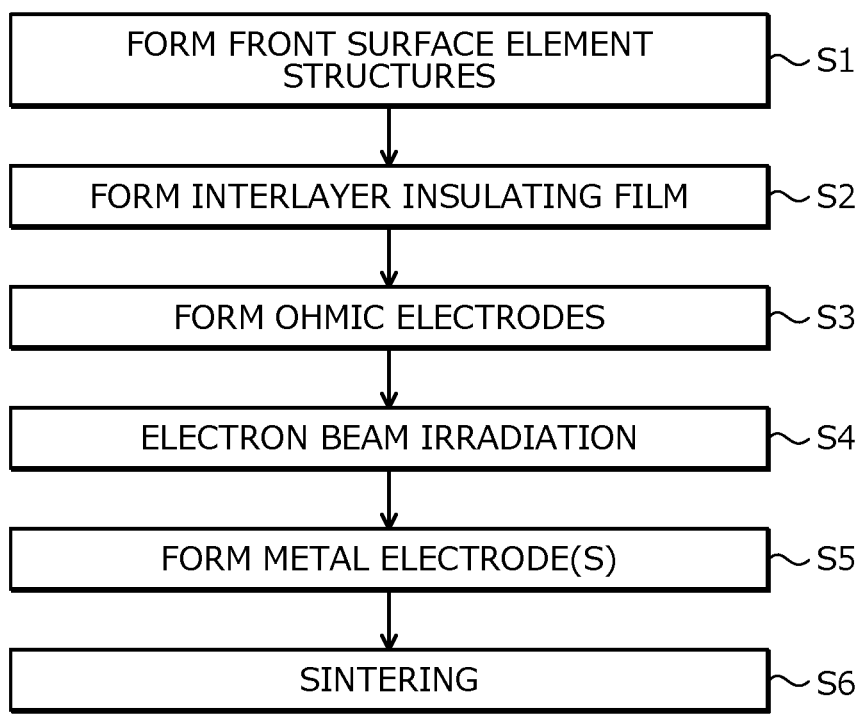
FIG. 3 is a flowchart of an outline of a method of manufacturing the silicon carbide semiconductor device according to the first embodiment.
Figure 4:
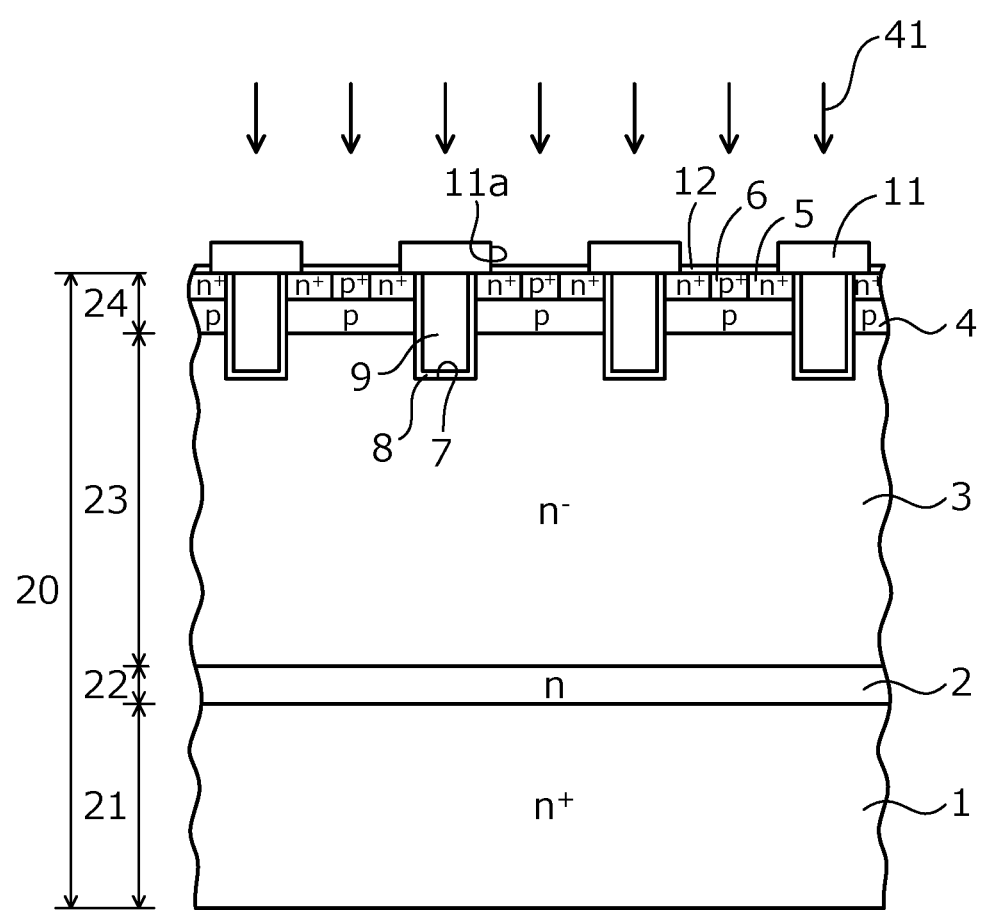
FIG. 4 is a cross-sectional view of a state of the silicon carbide semiconductor device according to the first embodiment during manufacture.

Next, a method of manufacturing the silicon carbide semiconductor device 10 according to the first embodiment will be described. FIG. 3 is a flowchart of an outline of the method of manufacturing the silicon carbide semiconductor device according to the first embodiment. FIG. 4 is a cross-sectional view of a state of the silicon carbide semiconductor device according to the first embodiment during manufacture. First, as depicted in FIG. 4, on the front surface of the n$^+$-type starting substrate (semiconductor wafer) 21 that forms the n$^+$-type drain region 1 and contains silicon carbide as a semiconductor material, the epitaxial layers 22, 23, 24 that form the n-type buffer region 2, the n$^-$-type drift region 3, and the p-type base region 4, respectively, are sequentially formed by epitaxial growth, whereby the semiconductor substrate (semiconductor wafer) 20 is fabricated.

Next, at the front side of the semiconductor substrate 20, by a general method, the trench gate structures configured by the p-type base region 4, the n$^+$-type source regions 5, the p$^+$-type contact regions 6, the trenches 7, the gate insulating film 8, and the gate electrodes 9 are formed as the front surface element structures (step S1). Next, the interlayer insulating film 11 is formed on the front surface of the semiconductor substrate 20 so as to cover the gate electrodes 9 (step S2). Next, by photolithography and etching, the interlayer insulating film 11 is selectively removed, forming the contact holes 11a that expose the n$^+$-type source regions 5 and the p$^+$-type contact regions 6.

Next, along parts of the front surface of the semiconductor substrate 20 exposed in the contact holes 11a and a surface of the interlayer insulating film 11, a metal film that is material of the ohmic electrodes 12 is formed. The metal film that is a material of the ohmic electrodes 12 is, for example, a nickel (Ni) film or a titanium (Ti) film that reacts with silicon (Si) atoms in the semiconductor substrate 20 to form a silicide. Next, for example, by a high-temperature heat treatment of at least 950 degrees C., the metal film is converted into a silicide, forming in each of the contact holes 11a, the ohmic electrode 12 (metal silicide film) in ohmic contact with the semiconductor substrate 20 (step S3).

Next, in ambient air, for example, an electron beam irradiation 41 is performed to an entire area of the semiconductor substrate 20, from the front surface of the semiconductor substrate 20 (step S4). In the electron beam irradiation 41 at step S4, an electron beam penetrates through the semiconductor substrate 20 in the depth direction from the front surface to the back surface, whereby the $Z_{1/2}$ center is introduced in an entire area of the semiconductor substrate 20. Provided the electron beam irradiation 41 is performed in an entire area of the semiconductor substrate 20, the electron beam irradiation 41 may be performed from a side surface or the back surface of the semiconductor substrate 20. The irradiation dose of the electron beam irradiation 41 is set in a range, for example, from about 200 kGy (=3.2× 1014/cm$^2$) to 800 kGy (=1.28×1015/cm$^2$).

When the irradiation dose of the electron beam irradiation 41 is at least the described lower limit, the minority carrier lifetime of the n$^-$-type drift region 3 may be reduced to be at most 70 ns and the hole density of the hole current flowing in the forward direction through the parasitic diode 30 is reduced. When the irradiation dose of the electron beam irradiation 41 exceeds the described upper limit, the $Z_{1/2}$ center increases excessively in the semiconductor substrate 20 and ON resistance increases about two times that in an instance in which the electron beam irradiation 41 is not performed. The irradiation dose of the electron beam irradiation 41 may be set to be at most, for example, about 500 kGy, whereby realization of low ON resistance becomes possible. For example, when the irradiation dose of the electron beam irradiation 41 is 400 kGy, increase of the ON resistance may be suppressed to about 10% of that in an instance in which the electron beam irradiation 41 is not performed.

Next, a metal electrode forming the source electrode 13 is formed at the front surface of the semiconductor substrate 20 (step S5). At this time, after the semiconductor substrate 20 is ground from the back surface to a product thickness or with the thickness as is at the time of input to the manufacturing process without back surface grinding, a metal electrode forming the drain electrode 14 may be further formed at the back surface of the semiconductor substrate 20. Next, a heat treatment (sintering) for baking the metal electrode is performed at a temperature of about 460 degrees C. (step S6). After the electron beam irradiation 41, a heat treatment at a temperature exceeding 400 degrees C. is not performed and therefore, the $Z_{1/2}$ center in the semiconductor substrate 20 does not disappear. As a result, the $Z_{1/2}$ center is left at the defect concentration introduced in the n-type buffer region 2 and the n$^-$-type drift region 3 by the electron beam irradiation 41. Therefore, the minority carrier lifetime of the n$^-$-type drift region 3 obtained by the electron beam irradiation 41 at step S4 is maintained. Thereafter, the semiconductor substrate 20 (semiconductor wafer) is diced (cut) into individual chips, whereby the silicon carbide semiconductor device 10 depicted in FIG. 1 is completed.

As described above, according to the first embodiment, after formation of the ohmic electrodes but before formation of the source electrode, the electron beam irradiation is performed with respect to an entire area of the semiconductor substrate (the n$^+$-type starting substrate and epitaxial layers). As a result, the $Z_{1/2}$ center is introduced in an entire area of the semiconductor substrate, enabling the minority carrier lifetime of the n$^-$-type drift region to be reduced since the $Z_{1/2}$ center introduced in the n$^-$-type drift region is a minority carrier lifetime killer. As a result, when the pn junction between the p-type base region and the n$^-$-type drift region is forward biased, the hole density of the hole current flowing in the forward direction through the parasitic diode formed by the pn junction is reduced, thereby enabling suppression of the occurrence of stacking faults from the n$^+$-type starting substrate to the epitaxial layers.

Further, according to the first embodiment, after the high-temperature heat treatment for forming the ohmic electrodes, the electron beam irradiation is performed and after the electron beam irradiation, no heat treatment is performed at a temperature exceeding 460 degrees C. Therefore, the $Z_{1/2}$ center introduced into the n$^-$-type drift region does not disappear due to the high-temperature heat treatment for forming the ohmic electrodes or a heat treatment after the electron beam irradiation. As a result, in the completed silicon carbide semiconductor device (product), the $Z_{1/2}$ center is left at the defect concentration introduced by the electron beam irradiation. Therefore, for example, the minority carrier lifetime of the n$^-$-type drift region may be shortened compared to an instance in which a high-temperature heat treatment for forming ohmic electrodes is performed after electron beam irradiation such as in Japanese Patent No. 6183080.

Further, according to the first embodiment, the electron beam irradiation of the semiconductor substrate is performed with an irradiation dose within the range described above, thereby enabling suppression of increases in the ON resistance, whereby variation of electrical characteristics due to the electron beam irradiation may be suppressed. Further, according to the first embodiment, the minority carrier lifetime of the n$^-$-type drift region is shortened, whereby the amount of charge of the minority carriers (holes) accumulated in the n$^-$-type drift region during forward biasing of the parasitic diode of the MOSFET may be reduced. As a result, during reverse recovery of the parasitic diode of the MOSFET, the amount of charge of the holes expelled from the n$^-$-type drift region to the source electrode may be reduced and switching loss of the MOSFET may be reduced.

Further, according to the first embodiment, the $Z_{1/2}$ center is introduced into an entire area of the semiconductor substrate by the electron beam irradiation, whereby the $Z_{1/2}$ center is introduced into the n$^-$-type drift region and the minority carrier lifetime of the n$^-$-type drift region is shortened. As a result, the minority carrier lifetime of the n$^-$-type drift region may be stably shortened with favorable controllability and cost may be reduced compared to an instance in which epitaxial layer thickness and impurity concentration are controlled to shorten the minority carrier lifetime. Further, according to the first embodiment, the $Z_{1/2}$ center is introduced to an entire area of the semiconductor substrate by the electron beam irradiation and therefore, even in the n-type buffer region, the minority carrier lifetime may be shortened by the $Z_{1/2}$ center introduced into the n-type buffer region.

Figure 5:
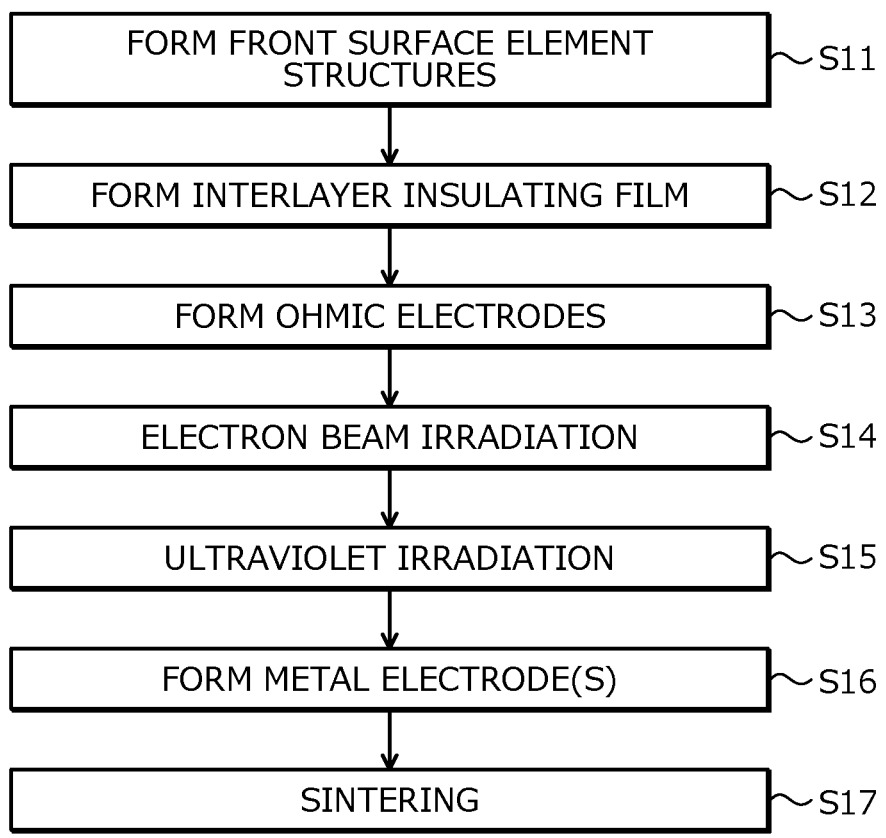
FIG. 5 is a flowchart of an outline of a method of manufacturing a silicon carbide semiconductor device according to a second embodiment.
Figure 6:
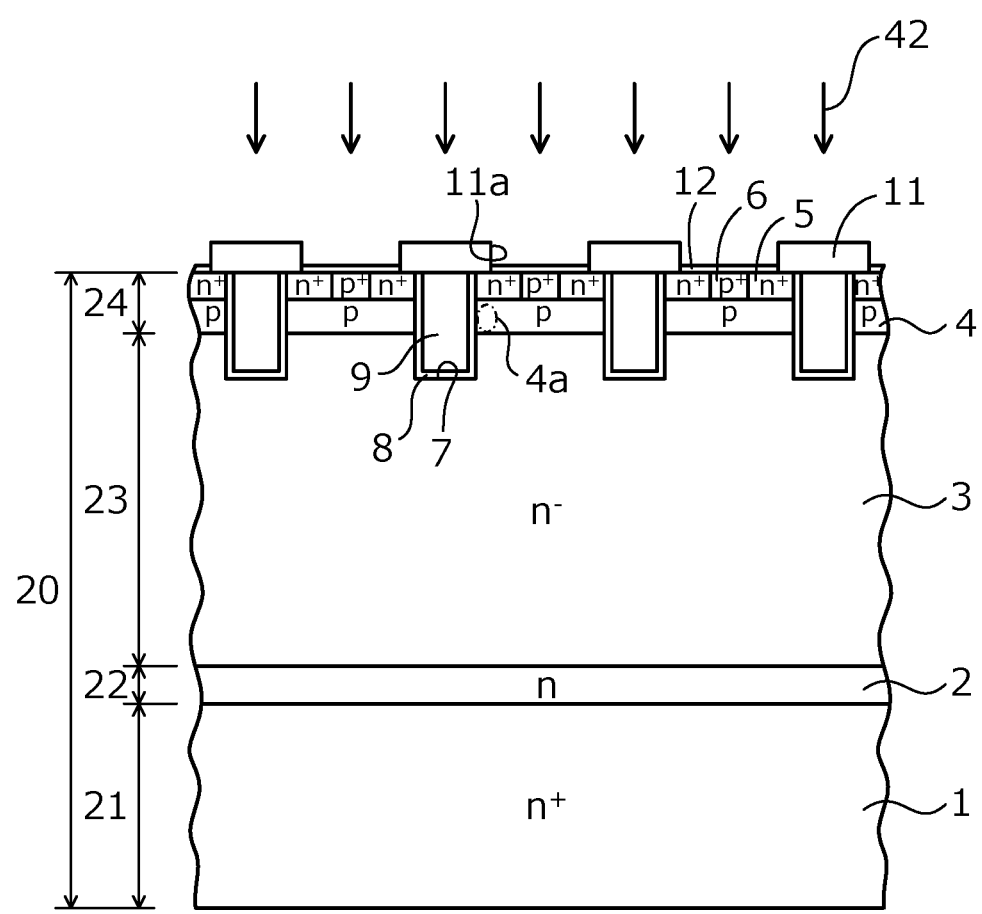
FIG. 6 is a cross-sectional view depicting a state of the silicon carbide semiconductor device according to the second embodiment during manufacture.

A method of manufacturing a silicon carbide semiconductor device according to a second embodiment will be described. FIG. 5 is a flowchart of an outline of the method of manufacturing the silicon carbide semiconductor device according to the second embodiment. FIG. 6 is a cross-sectional view depicting a state of the silicon carbide semiconductor device according to the second embodiment during manufacture. A structure of the silicon carbide semiconductor device according to the second embodiment is similar to the structure of the silicon carbide semiconductor device 10 according to the first embodiment (refer to FIGS. 1, 2A, 2B).

The method of manufacturing the silicon carbide semiconductor device according to the second embodiment depicted in FIG. 5 differs from the method of manufacturing the silicon carbide semiconductor device 10 according to the first embodiment depicted in FIG. 3 in that after the electron beam irradiation 41 (step S14 in FIG. 5) and shortening of the minority carrier lifetime of the n$^-$-type drift region but before the formation of metal electrode (step S16 in FIG. 5), an ultraviolet (UV) irradiation 42 (step S15 in FIG. 5, FIG. 6) is performed with respect to the semiconductor substrate 20.

In particular, in the second embodiment, as depicted in FIG. 6, similarly to the first embodiment, formation of the front surface element structures (step S11), formation of the interlayer insulating film 11 (step S12), formation of the ohmic electrodes 12 (step S13), and the electron beam irradiation 41 (step S14) are sequentially performed. Next, the ultraviolet irradiation 42 is performed from the front surface of the semiconductor substrate 20, whereby damage in the gate insulating film 8 caused by the electron beam irradiation 41 at step S14 is recovered (step S15).

In the ultraviolet irradiation 42 at step S15, for example, an ultraviolet lamp is used and under a temperature environment of at most about 460 degrees C. (for example, about 300 C), an ultraviolet ray having a wavelength of, for example, at most about 390 nm is irradiated from the front surface of the semiconductor substrate 20. An ultraviolet ray having a wavelength of at most 390 nm is light (electromagnetic wave) of a wavelength shorter than a wavelength corresponding to the energy of the bandgap (optical absorption edge: 3.26 eV) of silicon carbide and is transmitted by silicon carbide.

For example, in an instance in which only the electron beam irradiation 41 is performed, gate threshold voltage Vth of the MOSFET decreases about −0.6V from the design value. On the other hand, after the electron beam irradiation 41, when the ultraviolet irradiation 42 is performed for 60 minutes from the front surface of the semiconductor substrate 20 using an ultraviolet ray having a wavelength of, for example, 254 nm, the decrease from the design value of the gate threshold value Vth of the MOSFET may be suppressed to about −0.1V.

For example, a penetration depth of an ultraviolet ray having a wavelength of 254 nm into silicon carbide is 1.0 μm and since a depth from the front surface of the semiconductor substrate 20 to a source-side end of a channel (when the MOSFET is ON, n-type inversion layer formed at parts of the p-type base region 4 between the n⁻-type drift region 3 and the n⁺-type source regions 5) 4a is less than 1.0 μm, the penetration of the ultraviolet ray into a part of the gate insulating film 8 adjacent to the channel, at the sidewalls of the trenches 7 is possible.

In the ultraviolet irradiation 42 at step S15, the semiconductor substrate 20 may be irradiated with an ultraviolet ray having a wavelength of, for example, at least 250 nm. A suitable lower limit of the wavelength of the ultraviolet ray of the ultraviolet irradiation 42 is set within the range described above, thereby enabling the penetration depth of the ultraviolet ray into silicon carbide to be 1.0 μm. Even in an instance in which helium (He) irradiation or proton (H⁺) irradiation is performed from the front surface of the semiconductor substrate 20 instead of the ultraviolet irradiation 42, effects similar to those of the ultraviolet irradiation 42 may be obtained.

The ultraviolet irradiation 42 is performed before the formation of the metal electrode that forms the source electrode 13 (step S16 described hereinafter). Thereafter, the metal electrode is formed (step S16), sintering (step S17) and subsequent processes are sequentially performed similarly to the first embodiment, whereby the silicon carbide semiconductor device 10 depicted in FIG. 1 is completed. The processes at steps S11 to S14, S16, and S17 in the second embodiment suffice to be performed under similar conditions and methods as those at steps S1 to S6 (refer to FIG. 3) of the first embodiment, respectively.

As described above, according to the second embodiment, by the electron beam irradiation, effects similar to those of the first embodiment are obtained and after the electron beam irradiation but before the formation of the source electrode, the ultraviolet irradiation is performed from the front surface of the semiconductor substrate, thereby enabling decreases in the gate threshold voltage of the MOSFET to be suppressed.

Figure 7:
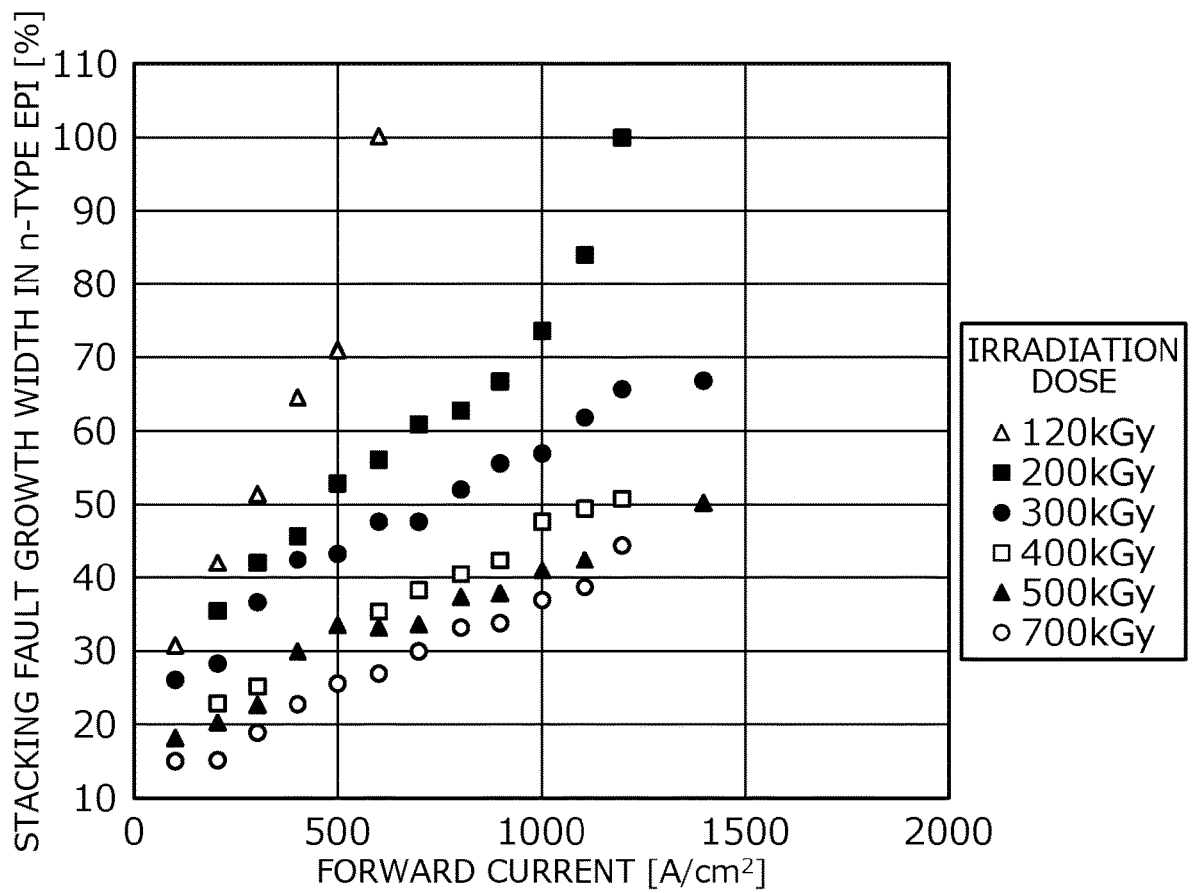
FIG. 7 is a characteristics diagram depicting a relationship between forward current and stacking fault growth width of an experimental example.

Next, a relationship between hole current (forward current) flowing in the forward direction through the parasitic diode 30 (refer to FIG. 1) of the MOSFET and stacking fault growth width was verified. FIG. 7 is a characteristics diagram depicting a relationship between forward current and stacking fault growth width of an experimental example. Here, the stacking fault growth width is a length that a bar-shaped stacking fault (refer to reference character 132b in FIG. 9) grows in the n-type epitaxial layers 22, 23, in a direction parallel to the front surface of the semiconductor substrate 20.

Along a horizontal axis in FIG. 7, current values [A/cm²] of the forward current of the parasitic diode 30 of the MOSFET are shown. Along a vertical axis in FIG. 7, as the growth width (stacking fault growth width in n-type epi) of stacking faults, of the bar-shaped stacking fault, the length of only a part that grew when a predetermined forward current was passed through the parasitic diode 30 is shown as a percentage [%] based on the length of the bar-shaped stacking fault before the predetermined forward current was passed through the parasitic diode 30.

According to the method of manufacturing the silicon carbide semiconductor device according to the first embodiment described above, multiple samples (of experimental example) were prepared by performing the electron beam irradiation 41 at respectively differing irradiation doses (range from 120 kGy to 700 kGy). For these samples of the experimental example, measured current values of the forward current flowing through the parasitic diode 30 of the MOSFET and measured growth widths of stacking faults in the n-type epitaxial layers 22, 23 under a temperature environment of 100 degrees C. are depicted in FIG. 7.

Further, while not depicted, for all of the samples of the experimental example, vacancy traps in the semiconductor substrate 20 were detected by a deep level transient spectroscopy (DLTS) technique. As a result, no helium or protons were detected in the semiconductor substrate 20 and it was confirmed that the minority carrier lifetime of the n⁻-type epitaxial layer 23 (the n⁻-type drift region 3) was shortened by the $Z_{1/2}$ center introduced by the electron beam irradiation 41.

From the results depicted in FIG. 7, for the experimental example, it was confirmed that the greater the irradiation dose of the electron beam irradiation 41 was for a sample, the lower was the growth width of the stacking fault for the sample. Further, it was confirmed that of the samples of the experimental example, samples for which the growth width (growth rate) of the stacking faults decreased with respect to the current value of the forward current of the parasitic diode 30 were samples for which the irradiation dose of the electron beam irradiation 41 was at least 200 kGy.

In the foregoing, without limitation to the embodiments described above, various modifications within a range not departing from the spirit of the invention are possible. For example, the present invention is not limited to a MOSFET and provided a trench gate structure is included, application is possible to other MOS-type semiconductor devices such as insulated gate bipolar transistors (IGBT).

According to the invention described above, the electron beam irradiation is performed to an entire area of the semiconductor substrate, whereby a vacancy trap is introduced into the drift region (second epitaxial layer), enabling the minority carrier lifetime of the drift region to be shortened to be at most 70 ns. As a result, when the pn junction between the third epitaxial layer and the second epitaxial layer is forward biased, the hole density of the hole current that flows in the forward direction through the parasitic diode formed by the pn junction may be reduced.

Further, according to the invention described above, the vacancy trap introduced into the drift region does not disappear by a heat treatment after the electron beam irradiation and therefore, the vacancy trap is left in the completed product at the defect concentration introduced by the electron beam irradiation. Therefore, the minority carrier lifetime of the drift region may be the shortest minority carrier lifetime feasible based on the defect concentration of the vacancy trap introduced by the electron beam irradiation.

Further, according to the invention described above, the irradiation dose of the electron beam irradiation is specified, enabling increases in the ON resistance to be suppressed. Further, according to the invention described above, the vacancy trap is introduced into an entire area of the semiconductor substrate by the electron beam irradiation and thus, the vacancy trap is introduced into the drift region, enabling the minority carrier lifetime to be shortened stably with favorable controllability compared to an instance in which the minority carrier lifetime is shortened by controlling the impurity concentration and/or the thickness of the epitaxial layers.

The silicon carbide semiconductor device and the method of manufacturing a silicon carbide semiconductor device according to the present invention achieve an effect in that manufacture is easy, the occurrence of stacking faults may be suppressed, and variation of electrical characteristics may be suppressed.

As described above, the silicon carbide semiconductor device and the method of manufacturing a silicon carbide semiconductor device according to the present invention are useful for trench gate semiconductor devices and, particularly, are suitable for trench gate MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having a pn junction through which a current flows in a forward direction, the silicon carbide semiconductor device comprising:
    a semiconductor substrate, including
        a starting substrate of a first conductivity type, having a first main surface and a second main surface opposite to each other, and
        a first epitaxial layer of the first conductivity type, a second epitaxial layer of the first conductivity type, and a third epitaxial layer, provided sequentially on the first main surface of the starting substrate, the first epitaxial layer having an impurity concentration lower than an impurity concentration of the starting substrate, the second epitaxial layer having an impurity concentration lower than the impurity concentration of the first epitaxial layer, the third epitaxial layer forming the pn junction with the second epitaxial layer, and including a plurality of first semiconductor regions of the first conductivity type formed on a second semiconductor region of a second conductivity type;
    a plurality of trenches penetrating the plurality of first semiconductor regions respectively and the second semiconductor region, and reaching the second epitaxial layer;
    a plurality of gate electrodes provided in the plurality of trenches respectively via a gate insulating film;
    a metal film in ohmic contact with the plurality of first semiconductor regions;
    a first electrode electrically connected to the first semiconductor regions via the metal film; and
    a second electrode provided at the second main surface of the starting substrate, wherein
    each of the starting substrate and the first, second and third epitaxial layers contains silicon carbide,
    the silicon carbide semiconductor device has a vacancy trap in an entire area of the semiconductor substrate, and
    the second epitaxial layer has a minority carrier lifetime that is at most 70 ns.

2. The silicon carbide semiconductor device according to claim 1, wherein
    the pn junction forms a parasitic diode, and
    a hole density of a hole current flowing in the forward direction through the parasitic diode decreases in the second epitaxial layer with increasing proximity to an interface between the first epitaxial layer and the starting substrate, from the pn junction.

3. The silicon carbide semiconductor device according to claim 1, wherein
    a hole density at the interface between the first epitaxial layer and the starting substrate is at most $1\times10^{15}/cm^3$.

4. The silicon carbide semiconductor device according to claim 1, wherein
    the metal film is further in ohmic contact with the second semiconductor region, and
    the first electrode is further electrically connected to the second semiconductor region via the metal film.

5. A method of manufacturing a silicon carbide semiconductor device having a pn junction through which a current flows in a forward direction, the method comprising:
    preparing a semiconductor substrate, including
        preparing a starting substrate of a first conductivity type having a first main surface and a second main surface opposite to each other;
        forming a first epitaxial layer of the first conductivity type at the first main surface of the starting substrate, the first epitaxial layer having an impurity concentration lower than an impurity concentration of the starting substrate;
        forming a second epitaxial layer of the first conductivity type on the first epitaxial layer, the second epitaxial layer having an impurity concentration lower than the impurity concentration of the first epitaxial layer;
        forming a third epitaxial layer of a second conductivity type on the second epitaxial layer, the third epitaxial layer forming the pn junction with the second epitaxial layer, wherein
        each of the starting substrate and the first, second and third epitaxial layers contains silicon carbide;
    forming a metal film in ohmic contact with the third epitaxial layer;
    irradiating an entire area of the semiconductor substrate with an electron beam at an irradiation dose in a range from 200 kGy to 800 kGy;
    forming a first electrode electrically connected to the third epitaxial layer via the metal film, after irradiating the entire area of the semiconductor substrate with the electron beam;
    sintering the first electrode through a heat treatment at a temperature of at most 460 degrees C.; and
    forming a second electrode on the second main surface of the starting substrate.

6. The method according to claim 5, wherein the irradiation dose of the electron beam is at most 500 kGy.

7. The method according to claim 5, further comprising:
after forming the third epitaxial layer but before forming the metal film,
- selectively forming a plurality of first semiconductor regions of the first conductivity type, at surface regions of the third epitaxial layer, a part of the third epitaxial layer excluding the plurality of first semiconductor regions being a second semiconductor region of the second conductivity type;
- forming a plurality of trenches penetrating the plurality of first semiconductor regions respectively and second semiconductor region, and reaching the second epitaxial layer; and
- forming a plurality of gate electrodes in the plurality of trenches respectively via a gate insulating film, wherein the metal film is formed in ohmic contact with the plurality of first semiconductor regions, the first electrode is formed electrically connected to the plurality of first semiconductor regions via the metal film; and after irradiating the entire area of the semiconductor substrate with the electron beam but before forming the first electrode,
- irradiating the gate insulating film at sidewalls of the plurality of trenches with an ultraviolet ray from a surface of the third epitaxial layer, under a temperature environment of at most 460 degrees C., the ultraviolet ray having a wavelength that is at most 390 nm.

8. The method according to claim 7, wherein
the metal film is formed further in ohmic contact with the second semiconductor region, and
the first electrode is formed further electrically connected to the second semiconductor region via the metal film.

\* \* \* \* \*